United States Patent
Wang et al.

(10) Patent No.: US 6,632,707 B1
(45) Date of Patent: Oct. 14, 2003

(54) METHOD FOR FORMING AN INTERCONNECT STRUCTURE USING A CVD ORGANIC BARC TO MITIGATE VIA POISONING

(75) Inventors: Fei Wang, San Jose, CA (US); Lynne A. Okada, Sunnyvale, CA (US); Ramkumar Subramanian, San Jose, CA (US); James K. Kai, San Francisco, CA (US); Calvin T. Gabriel, Cupertino, CA (US); Lu You, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/058,227

(22) Filed: Jan. 29, 2002

Related U.S. Application Data

(60) Provisional application No. 60/265,080, filed on Jan. 31, 2001.

(51) Int. Cl.[7] .......................... H01L 21/44; H01L 21/00; H01L 21/48; H01L 21/50
(52) U.S. Cl. ........................................ 438/110; 438/72
(58) Field of Search ............................ 438/72, 110, 692, 438/637, 629

(56) References Cited

U.S. PATENT DOCUMENTS

| | | | | |
|---|---|---|---|---|
| 5,946,580 A | * | 8/1999 | Wu | 438/303 |
| 6,096,637 A | * | 8/2000 | Sriram et al. | 438/643 |
| 6,114,243 A | * | 9/2000 | Gupta et al. | 438/687 |
| 6,156,485 A | * | 12/2000 | Tang et al. | 430/313 |
| 6,174,800 B1 | * | 1/2001 | Jang | 438/629 |

* cited by examiner

Primary Examiner—Craig Thompson

(57) ABSTRACT

A method for forming a metal interconnect structure in a semiconductor device with the elimination of via poisoning during trench mask formation employs a CVD organic BARC that isolates the low k dielectric film. The CVD organic BARC is deposited over the low k dielectric film and in the via hole. Once the trench mask has been formed on the CVD organic BARC, the CVD organic BARC may be removed in the same process as the photoresist of the trench mask layer. A properly formed trench will have been created since the via poisoning and resist scumming were substantially eliminated by the presence of the CVD organic BARC.

8 Claims, 3 Drawing Sheets

METHOD FOR FORMING AN INTERCONNECT STRUCTURE USING A CVD ORGANIC BARC TO MITIGATE VIA POISONING

RELATED APPLICATIONS

This application claims priority from Provisional Application Ser. No. 60/265,080 filed on Jan. 31, 2001, the entire disclosure of which is hereby incorporated by reference herein.

FIELD OF THE INVENTION

The present invention relates to the formation of metal interconnection layers during the manufacture of semiconductor devices, and more particularly to the prevention of via poisoning during the formation of a trench structure in a low k dielectric material.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by inter-wiring spacings. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor chips comprising five or more levels of metalization are becoming more prevalent as device geometries shrink to sub-micron levels.

A conductive plug filling a via hole is typically formed by depositing a dielectric interlayer on a conductive layer comprising of at least one conductive pattern, forming an opening in the dielectric layer by conventional photolithographic and etching techniques and filling the opening with conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with conductive material, typically a metal, to simultaneously form a conductive plug and electrical contact with a conductive line.

In efforts to improve the operating performance of a chip, low k dielectric materials have been increasingly investigated for use as replacements for dielectric materials with higher-k values. Lowering the overall k values of the dielectric layers employed in the metal interconnect layers lowers the RC of the chip and improves its performance. However, low k materials such as benzocyclobutene (BCB), hydrogen silsesquioxane (HSQ), SiOF, etc., are often more difficult to handle than traditionally employed higher k materials, such as an oxide. For example, low k dielectric materials are readily damaged by techniques used to remove photoresist materials after the patterning of a layer. Hence, a feature formed in a low k dielectric layer may be damaged when the photoresist mask used to form the feature (e.g., trench or via) is removed.

Other problems that have been observed when working with low k materials is that of via poisoning and resist scumming. For example, via poisoning may be observed after the formation of a via in a low k dielectric layer and the subsequent formation and patterning in the photoresist that forms the trench mask. The via poisoning may cause a mushroom shape of resist to form at the top of the via hole, and resist scum may be seen at the surface of the dielectric layer in the mask opening. An example of this is depicted in FIG. 1. A substrate 10, which may be a conductive material such as copper, is covered by a bottom etch-stop layer 12, which can be made of silicon nitride, for example. The low k dielectric layer 14 has been formed on the bottom etch stop layer 12. A cap layer 16, formed from silicon oxide, for example, covers the low k dielectric layer 14. The via hole 20 was previously formed in the low k dielectric layer 14. Upon deposition and patterning of the photoresist material 18, the mushroom shape 22 is observed due to the via poisoning. It is thought that the photoresist deposition and patterning process produces outgassing from the low k dielectric layer 14 to produce mushroom feature 22 and resist scum 24 within the trench pattern opening 26.

The outgassing prevents the resist from properly getting into the via hole 20 so that it piles up on top of the via hole 20. This outgassing problem leads to improperly formed topology on the wafer. The resist around the via hole 20 becomes very thick and difficult to pattern. When attempts are made to pattern and expose it, that area can not be exposed properly.

Attempts have been made to mitigate the via poisoning and resist scumming problem. One of these is to provide a baking step before the formation of the trench mask layer. Although this has been seen to help the via poisoning problem, it does not substantially eliminate the problem. Other methodology that has been attempted is to provide spin-on organic BARC in the via, but the relatively low adhesion of this material to the via sidewalls and bottom has caused this approach to fail in substantially eliminating via poisoning concerns. Another method to eliminate via poisoning concerns is to provide a thick layer of oxide within the via, but this has the disadvantage of undesirably reducing the via size.

There is thus a need for a method for substantially eliminating via poisoning concerns when forming a metal interconnect structure when low k dielectric material is employed in the interconnect structure.

SUMMARY OF THE INVENTION

These and other needs are met by the present invention which provides a method of forming an interconnect structure comprising the steps of forming a via hole in a low k dielectric, the via hole having a bottom and sidewalls. A bottom anti-reflective coating (BARC) is deposited by chemical vapor deposition (CVD) to cover the bottom and sidewalls of the via hole. A photoresist mask is then deposited and patterned on the low k dielectric layer. The patterned photoresist mask contains an opening that is at least partially over the via hole and low k dielectric layer.

By the provision of a CVD BARC that covers the bottom and sidewalls of a via hole, outgassing from the via hole is prevented during the formation of the photoresist mask on the low k dielectric layer. This has the result of substantially eliminating the via poisoning and resist scumming problem. The CVD BARC exhibits greater adhesion than the spin-on BARC of the prior art and therefore prevents outgassing more effectively than the spin-on BARC. Since the CVD BARC may be removed at the same time as the photoresist material of the photoresist mask, the via size is not reduced as in the prior art solutions that employed a thick oxide material in the via to prevent outgassing. Also, the process of depositing the BARC by the CVD process provides a high temperature that aids in the prevention of outgassing of the low k material in the via hole.

The foregoing and other features, aspects and advantages of the present invention will become more apparent in the following detailed description of the present invention when taken in conjunction with the accompany drawings.

DETAILED DESCRIPTION OF THE INVENTION

The present invention address and solves problems related to via poisoning and resist scumming that occur during the formation of metal interconnect structures in semiconductor processing technology. The problems are substantially solved by the present invention which provides for the deposition of a chemically vapor deposited bottom anti-reflective coating (CVD BARC) in the via hole formed in a low k dielectric layer. The CVD BARC serves to isolate the low k dielectric film without disadvantageously reducing the size of the via hole. Further, the chemical vapor deposition of the BARC produces an isolation film that has better adhesion to the bottom and sidewalls of the via hole. The CVD BARC prevents outgassing from the low k dielectric layer during the formation of the trench resist mask, and thereby avoids the via poisoning and resist scumming that may otherwise occur during the formation of the trench mask.

Figure 1:
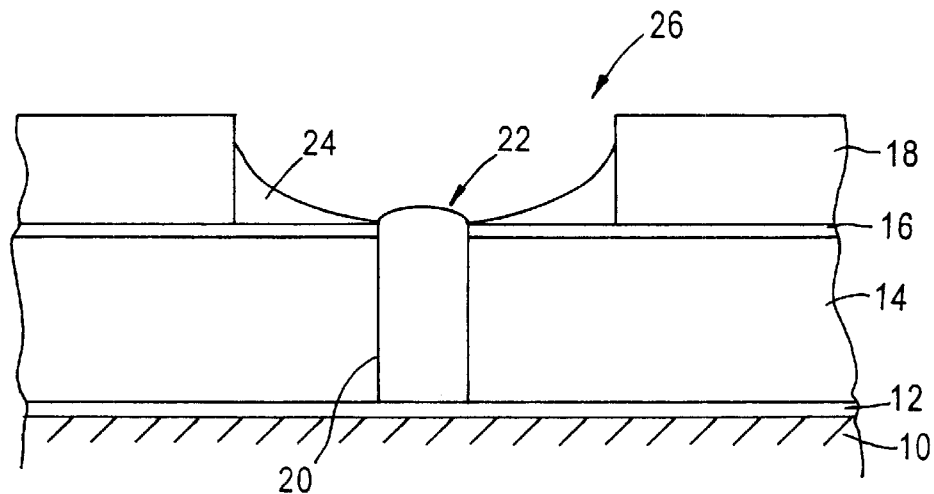
FIG. 1 is a cross-section of a metal interconnect portion that exhibits via poisoning and resist scumming after the formation of the structure in accordance with prior methodology.
Figure 2:
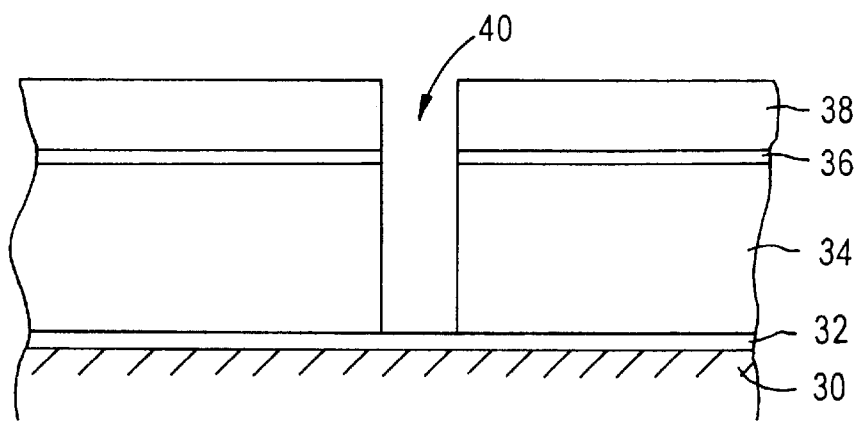
FIG. 2 is a cross-section of a metal interconnect portion during the formation of the via hole in accordance with embodiments of the present invention.

FIG. 2 depicts a cross-section of a portion of the metal interconnect structure formed in accordance with embodiments of the present invention. The conductive substrate 30, made of a conductive material such as copper, is protected by a bottom etch stop layer 32. A suitable material for the bottom etch stop layer 32 may be silicon nitride (SiN), for example. Other suitable etch stop layers include silicon carbide (SiC), silicon oxynitride (SiON), etc.

A low k dielectric layer 34 has been formed upon the bottom etch stop layer 32. Low k dielectric layer 34 may be any of a number of different materials. For example, low k dielectric layer 34 may be one of a class of organic low k dielectric materials, such as benzocyclobutene (BCB), SILK, FLARE, etc. Alternatively, the low k dielectric material and low k dielectric layer 34 may comprise inorganic low k dielectric materials such as methyl silsesquioxane (MSQ), hydrogen silsesquioxane (HSQ), SiOF, etc. As shown in FIG. 2, the low k dielectric layer 34 is a single dielectric layer comprising a single material. In other embodiments of the present invention, however, the low k dielectric layer 34 may be formed of two separate layers, either of two different materials or the same material. When the low k dielectric layer 34 comprises two distinct layers, an etch stop layer may be provided between the two distinct layers. The etch stop layer may be made of material such as silicon nitride, for example. If an etch stop layer is not used, however, the two distinct dielectric layers may be made of different classes of dielectric materials, such as one layer being an inorganic dielectric layer, the other layer being an organic dielectric layer. This provides etch selectivity between the distinct low k dielectric layers.

A cap layer 36 is provided on the low k dielectric layer. The cap layer 36 may be made of silicon oxide, as an example.

A photoresist layer forms a via mask layer 38. The via mask layer 38 is deposited and patterned to provide a feature that will be etched into the low k dielectric layer 34 as a via hole. FIG. 2 depicts the via hole 40 that has been etched through the cap layer 36 and the low k dielectric layer 34 in accordance with the pattern provided in the via mask layer 38. The etching is selective so that the etch stops at the silicon nitride layer 32. A suitable etching chemistry for the low k dielectric layer is selected in dependence upon the particular low k material in the low k dielectric layer 34. Such etchants are well known to those of ordinary skill in the art.

Figure 3:
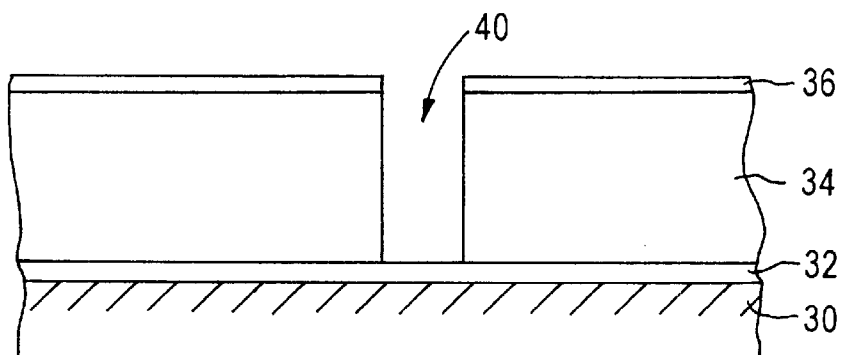
FIG. 3 depicts the cross-section of FIG. 2 following the removal of the via photoresist mask in accordance with embodiments of the present invention.

In FIG. 3, the interconnect portion is depicted after the removal of the via mask layer 38. The removal of the via mask layer 38 is accomplished by conventional photoresist removal techniques. For example, an oxygen/argon mixture $O_2/A_r$ may be used or preferably, a $N_2/H_2$ mixture may be used to move the photoresist. The bottom etch stop layer 32 protects the metal in substrate 30 from contamination during this process.

Figure 4:
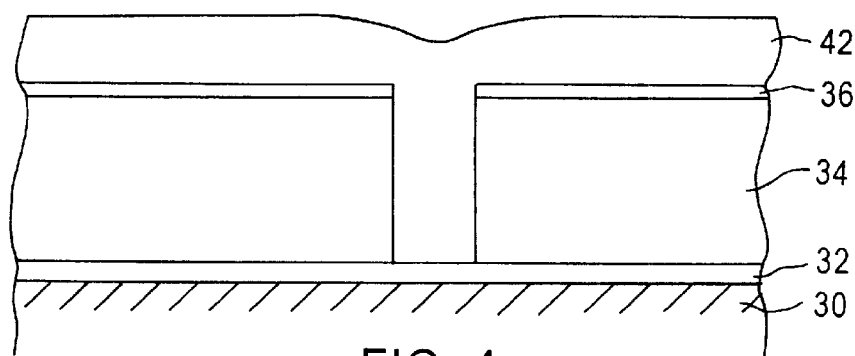
FIG. 4 depicts the cross-section of FIG. 3 following the deposition of the BARC by chemical vapor deposition in accordance with embodiments of the present invention.

FIG. 4 depicts the metal interconnect portion of FIG. 3 following CVD deposition of the BARC layer 42 within the via 40 and on top of the cap layer 36. The deposition of the CVD BARC 42 is a high temperature process in the preferred embodiments of the present invention. In certain preferred embodiments of the invention, the CVD BARC 42 that is deposited is an organic BARC, known to those of ordinary skill in the art. The CVD process is typically performed at temperatures greater than 300° C. One of the advantages of a CVD process is that its high temperature aids in reducing the via poisoning problems.

The CVD BARC 42 may be deposited to depths between approximately 500 Angstroms to approximately 2000 Angstroms, as exemplary depths. Since the CVD organic BARC 42 will be eventually removed from the via hole 40, it is acceptable for the CVD organic BARC 42 to fill in the via hole 40. This is in contrast to prior art methods in which an oxide is deposited within the via hole that undesirably fills in the via hole.

Figure 5:
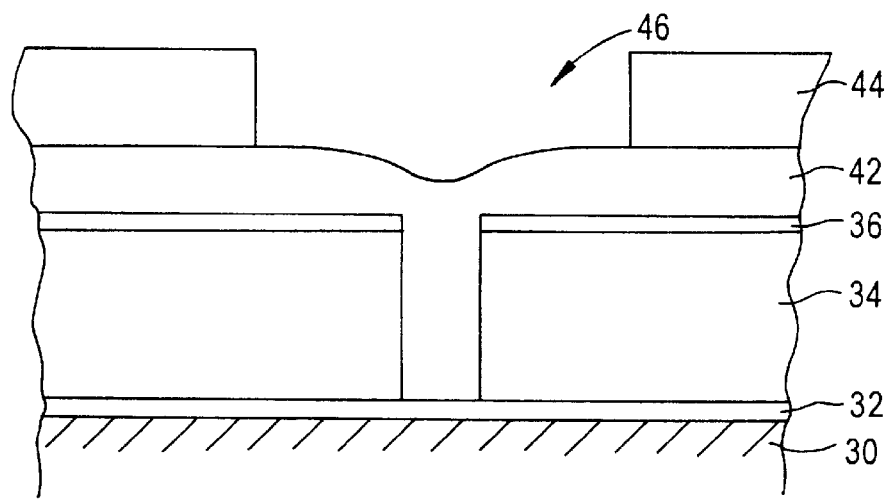
FIG. 5 depicts the metal interconnect portion of FIG. 4, after the deposition and patterning of a trench mask in accordance with embodiments of the present invention.

In FIG. 5, a photoresist layer forming a trench mask layer 44 is deposited and patterned on the CVD organic BARC layer 42. A feature 46 that is formed in the trench mask layer 44 represents the trench that will be etched into the low k dielectric layer 34. The CVD organic BARC layer 42 prevents the outgassing from the via hole and thus substantially eliminates via poisoning and resist scumming. The mushroom pattern at the top of the via hole is not observed.

Figure 6:
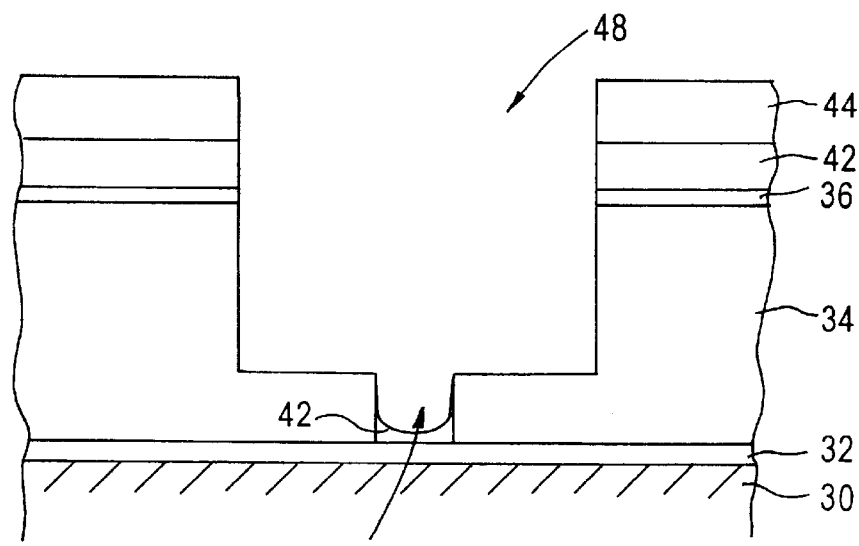
FIG. 6 depicts the metal interconnect portion of FIG. 5 after a timed etch has been performed to create a trench in the dielectric layer in accordance with embodiments of the present invention.
Figure 7:
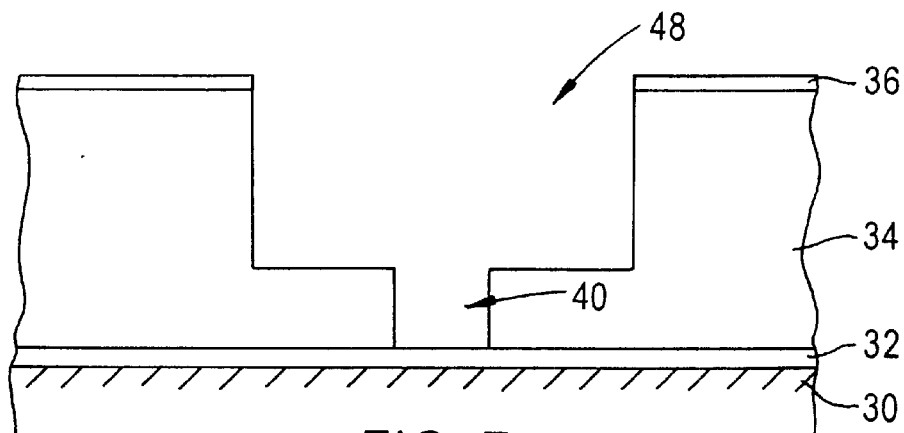
FIG. 7 depicts the metal interconnect portion of FIG. 6 following removal of the trench mask and the CVA BARC in accordance with embodiments of the present invention.

As depicted in FIG. 6, a timed etch is performed to transfer the trench pattern 46 in the trench mask layer 44 into the upper portion of the dielectric layer 34. The etching proceeds through the CVD organic BARC layer 42, the cap layer 36 and the upper portion of the low k dielectric layer 34, A suitable etching chemistry will again be selected based upon the particular dielectric material comprising the low k dielectric layer 34. Such etchants are well known to those of ordinary skill in the art. As shown in FIG. 6, a portion of the CVD organic BARC layer 42 is likely to remain within the via hole 40. This remaining portion of the CVD organic BARC layer 42 is removed, as depicted in FIG. 7, along with the photoresist in the trench mask layer 44 and the CVD organic BARC material 42 that is on top of the cap layer 36. The same etchant, such as $N_2/H_2$, may be used to remove the photoresist in the trench mask layer 44 and the CVD organic BARC layer 42.

Figure 8:
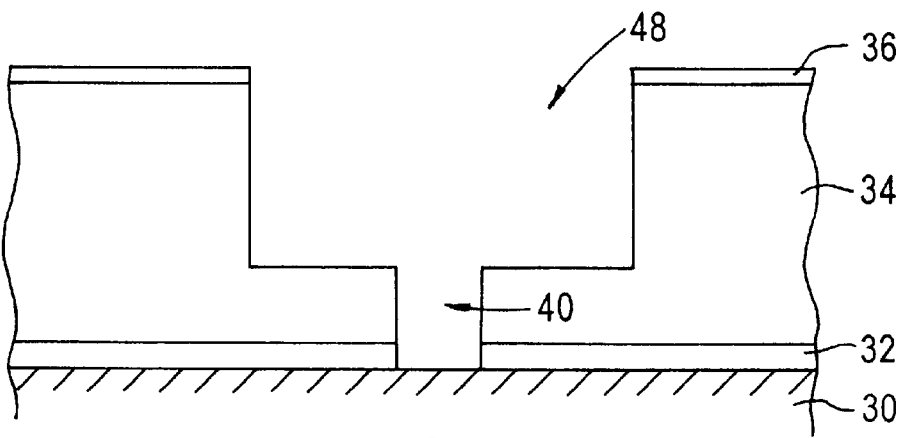
FIG. 8 depicts a metal interconnect portion of FIG. 7 after the bottom etch stop layer is removed from within the via hole in accordance with embodiments of the present invention.

In FIG. 8, the silicon nitride of the bottom etch-stop layer 32 has been removed by $CHF_3/N_2$, for example.

Figure 9:
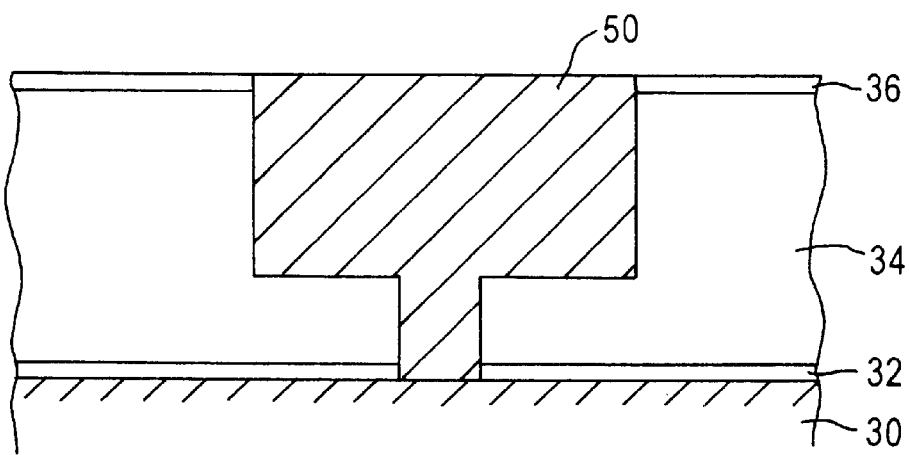
FIG. 9 depicts the metal interconnect portion of FIG. 8 after a conductive material is deposited within the trench and via hole in accordance with embodiments of the present invention.

In FIG. 9, the trench 48 and via hole 40 that have been formed in low k dielectric layer 34 are filled with conductive material, such as copper. Although, certain low k dielectric materials may form a self-diffusion barrier, in conventional practice a barrier material and a seed layer may be provided prior to the deposition of the copper. These steps are not depicted in order not to obscure the present invention.

The CVD organic BARC layer prevents the outgassing and substantially eliminates the via poisoning and resist scumming problem of the prior art. The CVD organic BARC thus acts to isolate the low k dielectric layer 34 during the trench mask formation and patterning process. The structures formed in the low k dielectric layer 34, such as the trench, is of higher quality due to the substantial elimination of the via poisoning and resist scumming problems in accordance with the methodology of the present invention.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming an interconnect structure, comprising the steps of:

forming a via hole in a low k dielectric layer, the via hole having a bottom and sidewalls;

depositing by chemical vapor deposition (CVD) a bottom anti-reflective coating (BARC) to cover the bottom and sidewalls of the via hole;

depositing and patterning a photoresist mask on the low k dielectric layer, the patterned photoresist mask containing an opening at least partially over the via hole in the low k dielectric layer.

2. The method of claim 1, wherein the CVD BARC is a CVD organic BARC.

3. The method of claim 2, further comprising etching the low k dielectric layer in accordance with the opening in the photoresist mask, such that a trench is formed in the low k dielectric layer over the via hole.

4. The method of claim 3, further comprising removing the CVD organic BARC and the photoresist mask in a single removal step.

5. The method of claim 4, further comprising depositing conductive material in the via hole and the trench.

6. The method of claim 5, wherein the conductive material is copper or a copper alloy.

7. The method of claim 2, wherein the step of depositing by CVD is performed at temperatures greater than approximately 300° C.

8. The method of claim 2, wherein the CVD organic BARC is deposited to a depth of between approximately 500 to approximately 2000 Angstroms.

* * * * *